United States Patent [19]

Monzen et al.

[11] Patent Number: 5,197,650
[45] Date of Patent: Mar. 30, 1993

[54] DIE BONDING APPARATUS

[75] Inventors: Masahiko Monzen; Akio Shimoyama, both of Tenri; Noriki Iwasaki, Nara, all of Japan

[73] Assignee: Sharp Kabushiki Kaisha, Osaka, Japan

[21] Appl. No.: 862,181

[22] Filed: Apr. 2, 1992

Related U.S. Application Data

[63] Continuation-in-part of Ser. No. 753,901, Sep. 3, 1991, abandoned.

[30] Foreign Application Priority Data

Sep. 18, 1990 [JP] Japan .................. 2-249406

[51] Int. Cl.⁵ .............................. B23K 31/12
[52] U.S. Cl. ............................ 228/6.2; 228/7; 228/103
[58] Field of Search .............. 228/6.2, 7, 8, 102, 228/103, 56.5; 156/DIG. 1; 101/483

[56] References Cited

U.S. PATENT DOCUMENTS

| | | | |
|---|---|---|---|
| 2,034,308 | 3/1936 | Morgan | 101/483 |
| 3,044,202 | 7/1962 | Lindmark | 101/483 |
| 4,585,931 | 4/1986 | Duncan et al. | 235/464 |
| 4,809,342 | 2/1989 | Kappner | 235/464 |
| 4,913,335 | 4/1990 | Yoshida | 228/103 |

FOREIGN PATENT DOCUMENTS 1-227442 9/1989 Japan .................. 228/102

OTHER PUBLICATIONS

"Specifications: Innerlead Bonder Model 1325", Kulicke & Soffa Industries, Inc., 1975.

Primary Examiner—Richard K. Seidel
Assistant Examiner—Jeffrey T. Knapp
Attorney, Agent, or Firm—Nixon & Vanderhye

[57] ABSTRACT

A die bonding apparatus includes a device for making a coarse surface in a region where an identifier is to be applied to a lead frame; an application device for applying the identifier to the coarse surface region, a dividing device for dividing a wafer into chips, a test device for testing the wafer which has not been divided into chips yet in positions corresponding to the prospective chips, a storage device for storing information about positions of the chips on the wafer and the test results, a die bonding device picking out the chips from the wafer for die-bonding them to the lead frame having the identifier, a reading device for reading the identifier of the lead frame to which the chips are to be die-bonded, an information processing device for adding information which the identifier contains to the test results and position information about each of the chips to make test information, and an output device for outputting the test information.

12 Claims, 6 Drawing Sheets

DIE BONDING APPARATUS

RELATED APPLICATIONS

The present application is a continuation-in-part of U.S. application Ser. No. 07/753,901, filed Sep. 3, 1991, now abandoned.

BACKGROUND OF THE INVENTION

1. Field of the Invention

The present invention relates to a die bonding apparatus for performing die bonding which is one of stages in a semiconductor manufacturing process.

2. Description of the Prior Art

In a conventional die bonding apparatus, map information (information expressing positions of all chips and their quality) is first made based upon a quality check (the first test) of a wafer before divided into chips. In accordance with the resultant map information, the chips having the identical standing in quality together are fixed to a lead frame by die bonding.

However, such a conventional die bonding apparatus has disadvantages as mentioned below.

For example, lead frames used in a conventional die bonding are not marked with identification numbers, marks or the like; and so, it is impossible to know which standing of chips were die-bonded and to which lead frame they were die-bonded. Then, information useful in the first test, such as the type of the used apparatus, test data, standings in quality and the like, becomes useless when the die bonding is completed; that is, the information used in the first test cannot be effectively employed at the latter stages in the process.

SUMMARY OF THE INVENTION

The present invention provides a die bonding apparatus which comprises processing means for making a coarse surface in a region where an identifier is to be applied to a lead frame, application means for applying an identifier to the coarse surface region, dividing means for dividing a wafer into chips, test means for testing the wafer which has not been divided into chips yet, in positions corresponding to the prospective chips, storage means for storing information about positions of the chips on the wafer and the test results, die bonding means picking out the chips from the wafer for die-bonding them to the lead frame having the identifier, reading means for reading the identifier of the lead frame to which the chips are to be die-bonded, information processing means for adding information which the identifier contains to the test results and position information about each of the chips to make test information, and output means for outputting the test information.

The identifier is preferably a bar code.

The identifier may be a combination of a plurality of holes made in the lead frame.

The application means or the processing means is preferably a laser marker.

DETAILED DESCRIPTION OF THE PREFERRED EMBODIMENT

Now, an embodiment according to the present invention will be described with reference to the accompanying drawings.

Figure 1:
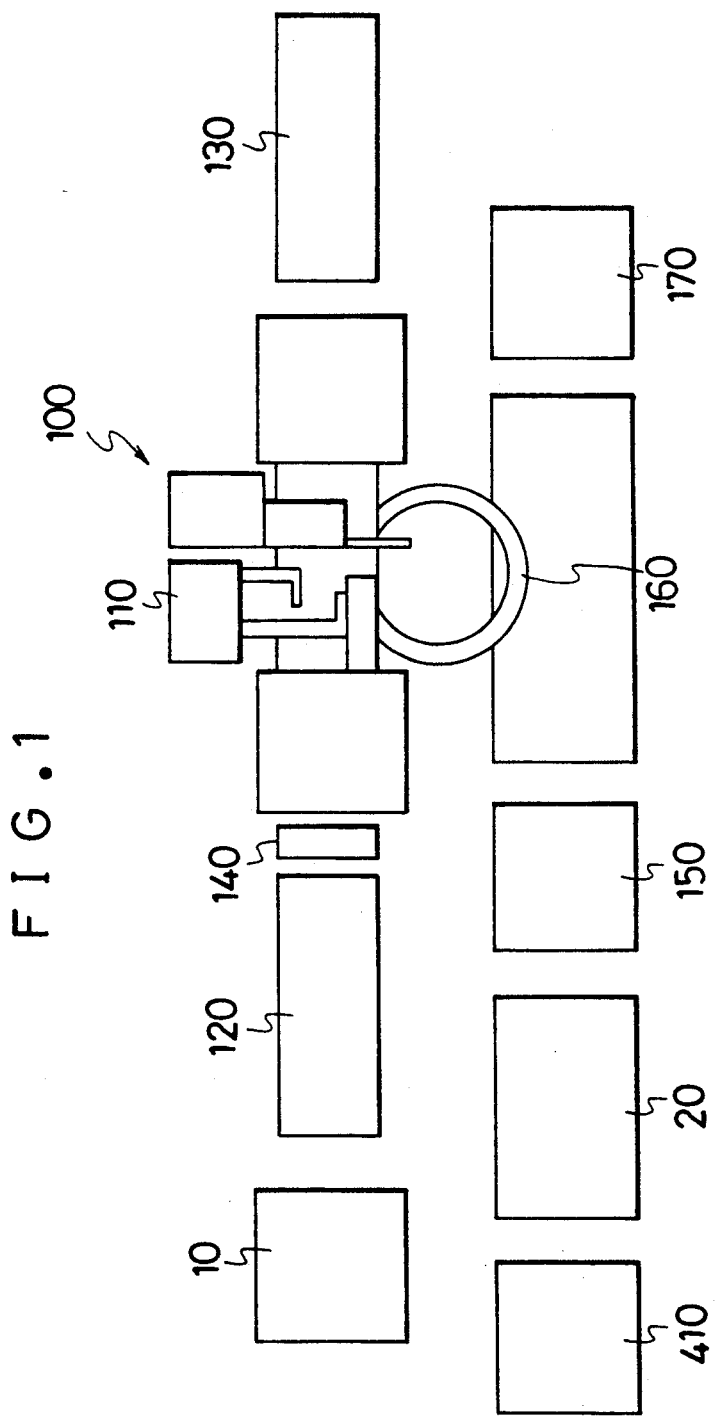
FIG. 1 is a schematic plan view showing an embodiment of a die bonding apparatus according to the present invention.
Figure 2:
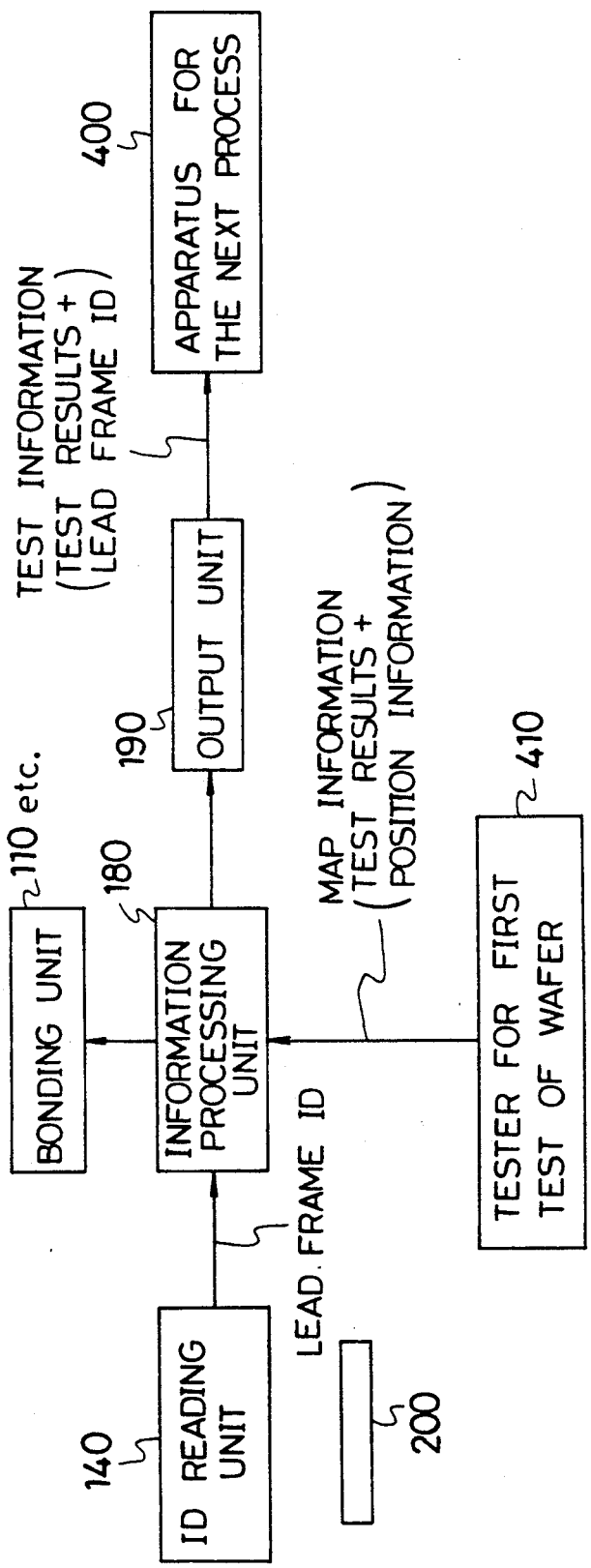
FIG. 2 is a schematic electrical block diagram showing the die bonding apparatus.
Figure 3:
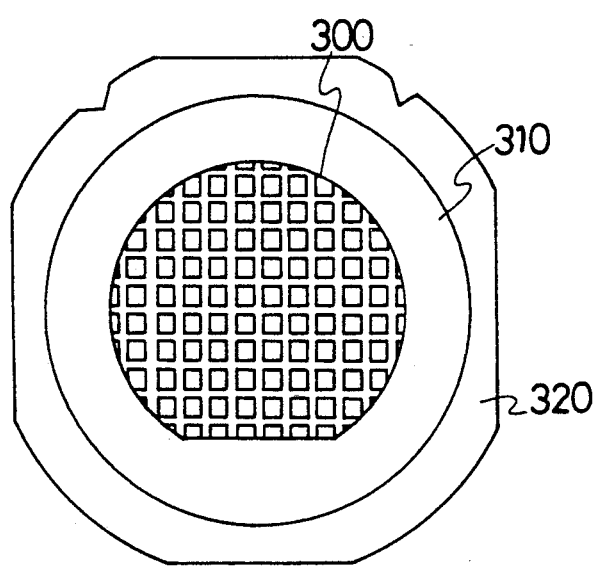
FIG. 3 is a plan view showing a wafer.
Figure 4:
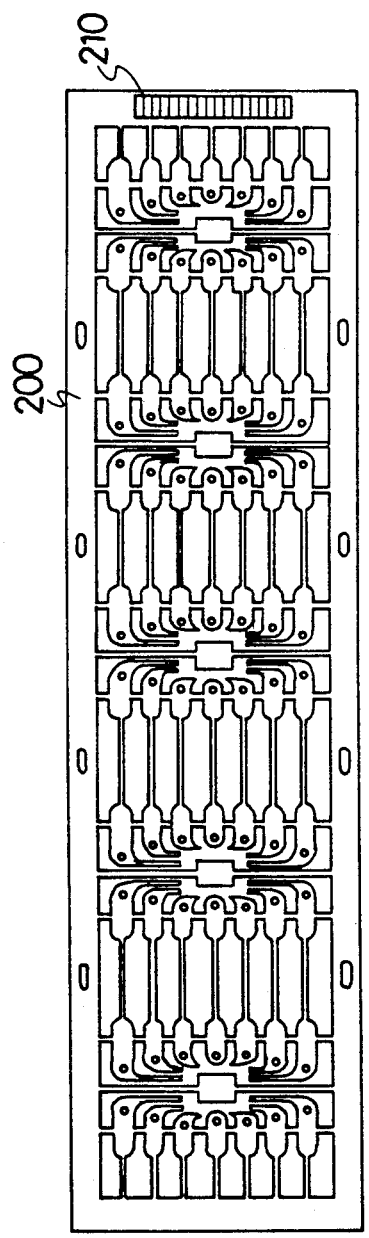
FIG. 4 is a plan view showing a lead frame.
Figure 5:
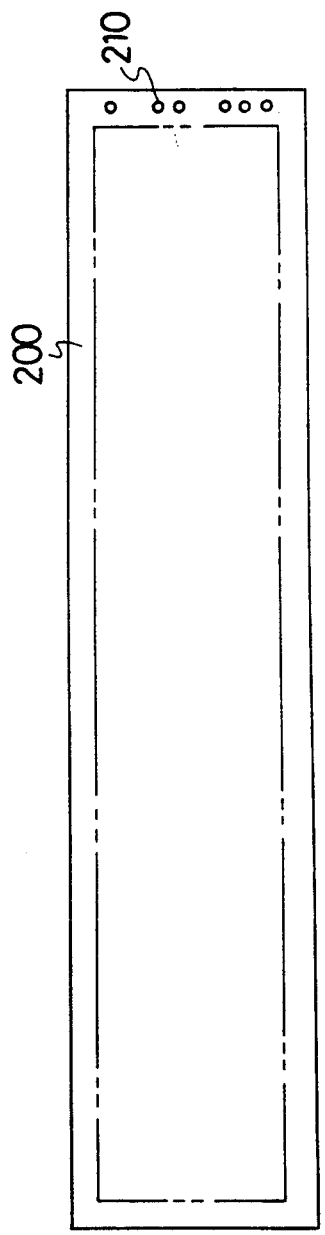
FIG. 5 is a plan view showing a modification of the lead frame.

FIG. 1 is a schematic plan view showing an embodiment of a die bonding apparatus according to the present invention, FIG. 2 is a schematic electric block diagram showing the bonding apparatus, FIG. 3 is a plan view showing a wafer, and FIGS. 4 and 5 are plan views showing lead frames.

A die bonding apparatus 100 according to the present invention has a tester 410 for checking a quality of a wafer 300 (performing the first test about the wafer) in positions corresponding to prospective chips before the wafer is divided into the chips, a dicing device 20 for dividing the tested wafer into the chips, a marker 10 for marking a lead frame 200 with an identifier 210 in advance, a die bonding unit 110 for die-bonding chips picked out from the wafer 300 to the lead frame 200, a frame loader 120 which accommodates the lead frame 200 before the chips are die-bonded to it, a frame unloader 130 which accommodates the lead frame 200 with the chips die-bonded to it, a lead frame ID reading unit 140 for reading an identifier (referred to as "lead frame ID" hereinafter) 210 of the lead frame 200 supplied from the frame loader 120, a wafer loader 150 for supplying the wafer 300 to a wafer expand unit 160 mentioned later, a wafer expand unit 160 for expanding the wafer 300 supplied from the wafer loader 150, a wafer unloader 170 which accommodates a wafer holder 320 for the wafer 300 from which the chips have been picked out, an information processing unit 180 reading the map information containing the lead frame ID 210, the results of the first test and the information about positions of the chips for making test information by adding the lead frame ID 210 to the results of the first test, and an output unit 190 for outputting the test information to an apparatus 400 for the next process.

A die bonding process in the die bonding apparatus will be described below.

The wafer 300 is set in the wafer holder 320, divided into chips and affixed to a wafer sheet 310 (FIG. 3). The wafer holder 320 together with the wafer 300 is housed in the wafer loader 150. The wafer 300 drawn out of the wafer loader 150 is set in the wafer expand unit 160 to be ready for picking-out of the chips.

On the other hand, the lead frame 200 having the lead frame ID 210 is housed in the frame loader 120. The lead frame ID 210 of the lead frame 200 drawn out of the frame loader 120 is read by the lead frame ID reading unit 140 to be transferred to the information processing unit 180. The lead frame ID 210 is formed in a location where no effect is exerted on the product, at and around the end of the lead frame 200 or the like, by using the marker 10 before it is housed in the frame loader 120. While a bar code is preferable as the lead frame ID 210, a combination of a plurality of holes made in a part of the lead frame 200 may be employed, as shown in FIG. 5. As the marker 10, a laser marker which employs laser to apply the lead frame ID 210 to the lead frame 200 may be preferably used.

The chips are picked out by the die bonding unit 110 and die-bonded to the lead frame 200. Since the information processing unit 180 receives and stores the map information containing the results of the first test and the information on the chip positions, the information on the chip positions is transferred to the die bonding unit 110, and the die bonding unit 110 performs die bonding the chips in accordance with the position information. Simultaneous with the die bonding, the information processing unit 180 adds the information about the lead frame 200, or the information about which standing of chips was die bonded and about which lead frame 200 they were die-bonded to, to the test results to make it the test information. Specifically, the lead frame ID 210 is added to the test results. The information processing unit 100 controls the die bonding unit 110, the frame loader 120, the frame unloader 130, the wafer loader 150 and the wafer unloader 170.

After the die bonding to the lead frame 200 is completed, the lead frame 200 is sent to and housed in the frame unloader 130. Then, after all the good chips from the wafer 300 are die-bonded, the wafer holder 320 is sent to and housed in the wafer unloader 170.

The output unit 190 transfers the test information to which the information about the lead frame 200 has been added by the information processing unit 180, or the information about which standing of chips are die-bonded and about which lead frame 200 they are die-bonded to, to the apparatus 400 for the next process.

The apparatus 400, which may be a wire bonding apparatus, for example, receives the test information and accordingly performs wire bonding.

Thus, according to the present invention, information useful in the first test, such as the type of the apparatus, test data, standings in quality and the like, is effectively employed at the latter stages after the die bonding; for example, the information can be utilized for elaborate production control, quality control, and comparison in quality of a wafer divided into chips with the one after molded.

Now will be described a method of applying a bar code to a lead frame 200 with the lead frame ID 210 by using the marker 10 which is a laser marker.

The goal of this method is making a sharp contrast between a bar code and its background region to avoid an misreading by the reading unit 140.

Figure 6:
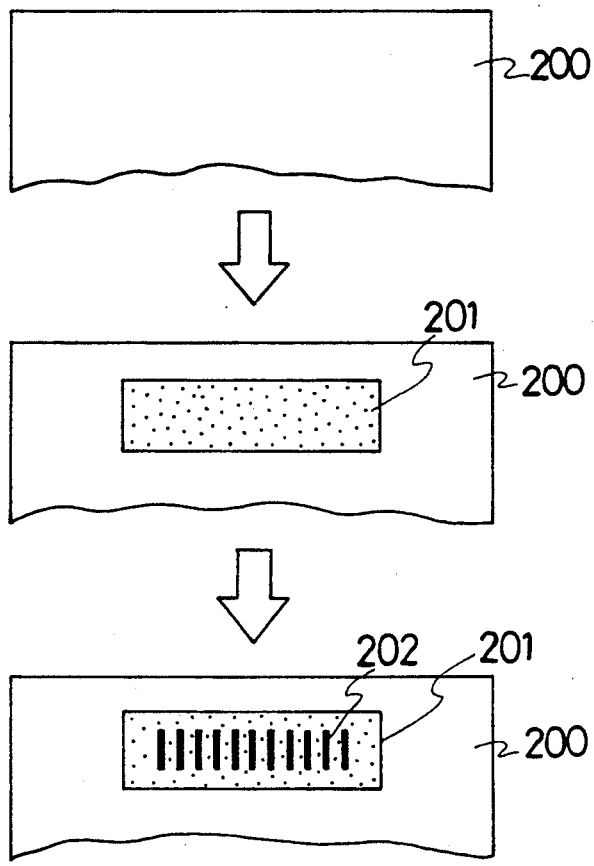
FIG. 6 is a view for explaining the theory of a method of applying a bar code to the lead frame.

FIG. 6 is a diagram for explaining the theory of this method. All the surface of a background region 201 of the bar code in the lead frame 200 is made uniformly coarse by a low power laser, and then, the bar code is made within the region 201 by a high power laser.

Figure 7:
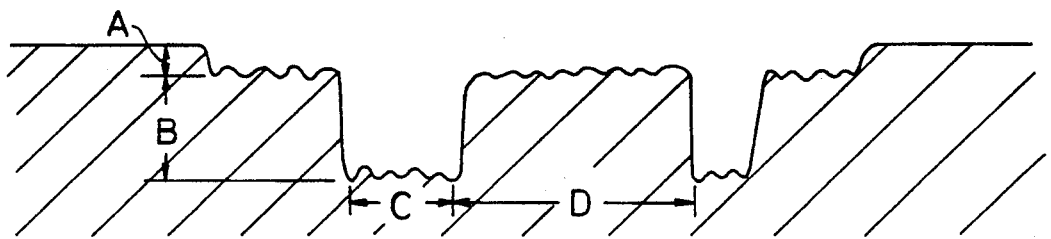
FIG. 7 is a sectional view showing a major portion of the lead frame with the bar code applied.

A cross-section of the lead frame 200 to which marking has been applied in the above-mentioned way is shown in FIG. 7, where a hole engraved in a depth A by laser is a background region while ditches engraved in a depth B by laser make up a bar code.

The optimum marking depths (A and B) which make the reading easier depends upon a material of the lead frame 200. According to an experiment, it is found that the following marking depth is best for each material:

| MATERIAL | A | B |
| --- | --- | --- |
| Copper (MF202) | 10–15 μm | 20 μm |
| Copper C194 | 0–5 μm | 18 μm |

-continued

| MATERIAL | A | B |
| --- | --- | --- |
| 42 Alloy | 0–5 μm | 5 μm |

A segmental length D of the background region shown in FIG. 7 is desirably set larger than a width C of a bar so as to obtain a more recognizable bar code (C<D).

As a result of an experiment, the optimum ratio is expressed by D/C=1.5 to 2.

It is also confirmed that scanning directions perpendicular to each other in the background region and the bar code make the reading of the bar code easier.

Figure 8:
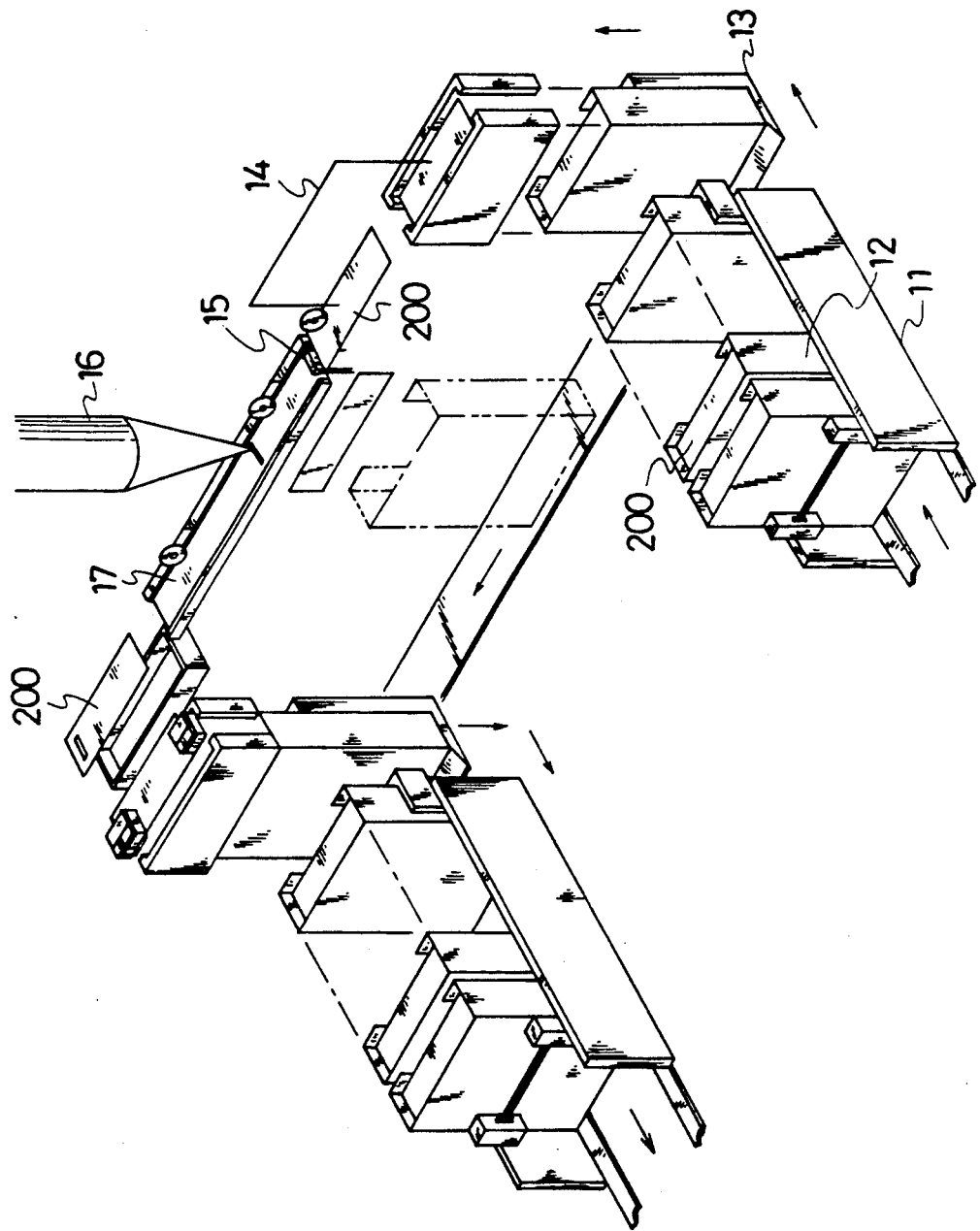
FIG. 8 is a perspective view showing a laser marker.

The above-mentioned marking of the lead frame 200 is carried out by the laser marker shown in FIG. 8 in the procedure described below:

i) Magazine 12 storing lead frames which is supplied from a magazine supplier 11 is lifted by a magazine lifter 13. The lead frame picked up from the magazine by a frame picking unit 14 is carried toward a laser emitter 16 by a frame carrier 15 and positioned under the laser emitter 16.

ii) Marking conditions of the laser marker are set as in a table (a) below, and thereafter, the surface of the lead frame is made coarse.

iii) The lead frame 200 is carried to a brushing unit 17 to purify the surface of the lead frame 200. However, this process step is not essential but it may be omitted.

iv) The lead frame 200 is carried back under the laser emitter, and output of the laser marker is set as in a table (b) to form a bar code.

v) The lead frame 200 is carried back to the brushing unit 17 to purify the surface, and thereafter, it is stored in the magazine. However, this brushing step is not essential but may be omitted as required.

| (a) SETTING LASER MARKER FOR MAKING COARSE SURFACE | | | | |
| --- | --- | --- | --- | --- |
| MATERIAL | CURRENT (A) | POWER (W) | FREQUENCY Qsw(kHz) | SCANNING VELOCITY (mm/s) |
| Copper | 11 | 18 | 1 | 90 |
| 42 Alloy | 9 | 10 | 5 | 90 |

| (b) SETTING LASER MARKER FOR FORMING BAR CODE | | | | |
| --- | --- | --- | --- | --- |
| MATERIAL | CURRENT (A) | POWER (W) | FREQUENCY Qsw(kHz) | SCANNING VELOCITY (mm/s) |
| Copper | 11.5 | 21 | 2 | 10 |
| 42 Alloy | 10.5 | 16 | 12 | 70 |

What is claimed is:

1. A die-bonding apparatus comprising:
means for emitting a first laser beam scanning a region on a metal lead frame to etch a coarse surface in the region;
means for emitting a second laser beam scanning the region to etch an identifier into the coarse surface region;
test means for testing a wafer at positions corresponding to the prospective chips and generating test data;
dividing means for dividing the wafer into chips;

storage means for storing information about positions of the chips on the wafer and the test data;

die-bonding means removing divided chips from the wafer and die-bonding the chips to the lead frame;

reading means for reading the identifier of the lead frame to which the chips are die-bonded;

information processing means for correlating information from the identifier with the test data and position information about each of the chips to generate test information; and output means for outputting the test information.

2. An apparatus according to claim 1, wherein said identifier is a bar code.

3. An apparatus according to claim 1, wherein said identifier is a combination of a plurality of holes made in said lead frame.

4. An apparatus according to claim 1, wherein said application means is a laser marker which employs laser to apply the identifier onto the lead frame.

5. An apparatus according to claim 1, wherein said processing means is a laser marker.

6. An apparatus according to claim 1, wherein the scanning directions of the first and second beams are perpendicular to each other.

7. An apparatus according to claim 1, wherein the power of the first laser beam is less than that of the second laser beam.

8. An apparatus according to claim 1, wherein a scanning speed of the first laser beam is greater than that of the second laser beam.

9. An apparatus according to claim 1, wherein the surface made by the second laser beam is more coarse than the surface made by the first laser beam.

10. An apparatus according to claim 1, wherein the depth of the etching of the first laser beam is less than the etching depth of the second laser beam.

11. An apparatus according to claim 1, wherein the first laser beam etches the coarse region to form a bar code background, and the second laser beam etches a bar code stripe, the width of the bar code background being greater than the width of the bar code stripe.

12. An apparatus according to claim 11, wherein the ratio of width of bar code background to the bar code stripe is in the range of 1.5 to 2.0.

* * * * *